(12) United States Patent
Baur et al.

(10) Patent No.: US 8,581,279 B2
(45) Date of Patent: Nov. 12, 2013

(54) LIGHT-EMITTING DIODE CHIP COMPRISING A CONTACT STRUCTURE

(75) Inventors: Johannes Baur, Regensburg (DE); Volker Härle, Laaber (DE); Berthold Hahn, Hemau (DE); Andreas Weimar, Regensburg (DE); Raimund Oberschmid, Sinzing (DE); Ewald Karl Michael Guenther, Regenstauf (DE); Franz Eberhard, Regensburg (DE); Markus Richter, Burglengenfeld (DE); Jörg Strauss, Augsburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 195 days.

(21) Appl. No.: 11/921,530

(22) PCT Filed: Jun. 2, 2006

(86) PCT No.: PCT/DE2006/000954
§ 371 (c)(1),
(2), (4) Date: Apr. 1, 2009

(87) PCT Pub. No.: WO2006/128446
PCT Pub. Date: Dec. 7, 2006

(65) Prior Publication Data
US 2009/0212307 A1 Aug. 27, 2009

(30) Foreign Application Priority Data

Jun. 2, 2005 (DE) .................. 10 2005 025 416

(51) Int. Cl.
*H01L 33/00* (2010.01)

(52) U.S. Cl.
USPC .............. 257/98; 257/E33.066; 257/E33.061; 257/E33.054

(58) Field of Classification Search
USPC .............. 257/98, E33.066, E33.054, E33.061
See application file for complete search history.

(56) References Cited

U.S. PATENT DOCUMENTS

| 5,008,718 A | 4/1991 | Fletcher et al. |
| 5,233,204 A | 8/1993 | Fletcher et al. |

(Continued)

FOREIGN PATENT DOCUMENTS

| DE | 197 41 609 | 4/1997 |
| DE | 196 40 594 | 4/1998 |

(Continued)

OTHER PUBLICATIONS

Schnitzer, I. et al., "30% external quantum efficiency from surface textured, thin-film light-emitting diodes", Appl. Phys., vol. 63, No. 16, pp. 2174-2178, Oct. 18, 1993.

(Continued)

*Primary Examiner* — Timor Karimy
(74) *Attorney, Agent, or Firm* — Cozen O'Connor

(57) ABSTRACT

In a luminescence diode chip having a radiation exit area (1) and a contact structure (2, 3, 4) which is arranged on the radiation exit area (1) and comprises a bonding pad (4) and a plurality of contact webs (2, 3) which are provided for current expansion and are electrically conductively connected to the bonding pad (4), the bonding pad (4) is arranged in an edge region of the radiation exit area (1). The luminescence diode chip has reduced absorption of the emitted radiation (23) in the contact structure (2, 3, 4).

29 Claims, 7 Drawing Sheets

(56) References Cited

U.S. PATENT DOCUMENTS

| | | | |
|---|---|---|---|
| 5,744,828 A * | 4/1998 | Nozaki et al. | 257/94 |
| 5,861,636 A | 1/1999 | Dutta et al. | |
| 6,066,861 A | 5/2000 | Höhn et al. | |
| 6,172,382 B1 * | 1/2001 | Nagahama et al. | 257/94 |
| 6,222,205 B1 | 4/2001 | Geng et al. | |
| 6,448,591 B1 * | 9/2002 | Juengling | 257/211 |
| 6,541,797 B1 | 4/2003 | Udagawa | |
| 6,559,075 B1 | 5/2003 | Kelly et al. | |
| 6,649,942 B2 | 11/2003 | Hata et al. | |
| 6,650,018 B1 | 11/2003 | Zhao et al. | |
| 6,674,233 B2 * | 1/2004 | Ellens et al. | 313/503 |
| 6,787,882 B2 * | 9/2004 | Kirchoefer | 257/596 |
| 7,135,709 B1 | 11/2006 | Wirth et al. | |
| 7,474,999 B2 * | 1/2009 | Scheffer | 703/14 |
| 2003/0006422 A1 | 1/2003 | Miki et al. | |
| 2003/0010993 A1 | 1/2003 | Nakamura et al. | |
| 2003/0057829 A1 | 3/2003 | Ellens et al. | |
| 2003/0102484 A1 | 6/2003 | Hata et al. | |
| 2003/0111667 A1 | 6/2003 | Schubert | |
| 2003/0209717 A1 | 11/2003 | Okazaki | |
| 2004/0004223 A1 | 1/2004 | Nagahama et al. | |
| 2005/0077538 A1 | 4/2005 | Heikman | |
| 2005/0239270 A1 | 10/2005 | Fehrer et al. | |
| 2006/0180804 A1 | 8/2006 | Stauss et al. | |
| 2006/0246687 A1 | 11/2006 | Kaiser et al. | |

FOREIGN PATENT DOCUMENTS

| | | |
|---|---|---|
| DE | 197 47 433 | 5/1999 |
| DE | 199 47 030 | 4/2001 |
| DE | 697 10 539 | 2/2002 |
| DE | 201 15 914 | 3/2003 |
| DE | 102 03 795 | 8/2003 |
| DE | 103 03 977 | 11/2003 |
| DE | 103 03 978 | 11/2003 |
| DE | 102 43 757 | 4/2004 |
| EP | 0 825 652 | 7/1997 |
| EP | 1 383 177 | 1/2004 |
| EP | 1 406 314 | 4/2004 |
| JP | 11 340509 | 12/1999 |
| JP | 2000-068594 A | 3/2000 |
| JP | 2000-91638 | 3/2000 |
| JP | 2001-244503 A | 9/2001 |
| JP | 2002-204027 A | 7/2002 |
| JP | 2003-510853 | 3/2003 |
| JP | 2003-133589 | 5/2003 |
| JP | 2004-363572 | 12/2004 |
| JP | 2005-12092 | 1/2005 |
| JP | 2005-19653 | 1/2005 |
| WO | WO 98/12757 | 3/1998 |
| WO | WO 98/14986 | 4/1998 |
| WO | WO 03/052838 | 6/2003 |

OTHER PUBLICATIONS

Kish, F.A. et al., "Very high-efficiency semiconductor wafer-bonded transparent-substrate $(Al_xGa_{1-x})_{0.5}In_{0.5}$ P/GaP light-emitting diodes", Appl. Phys. Lett., vol. 64, No. 21, pp. 2839-2841, May 23, 1994.

Algora, C., "Large-Area Infrared-Emitting Diodes With an Output Power Greater Than 1 W", Photonics Technology Letters, vol. 10, No. 3, pp. 331-333, Mar. 1998.

Notice to File a Response (Examination Report) issued in Korean Patent Application No. 10-2006-7016767 dated Apr. 29, 2011.

Bey, Jones, "Indium Nitride Bandgap Energy is Revealed", Laser Focus, Bd. 39, Nr. 1, 1. Jan. 1, 2003. (4 pages).

* cited by examiner

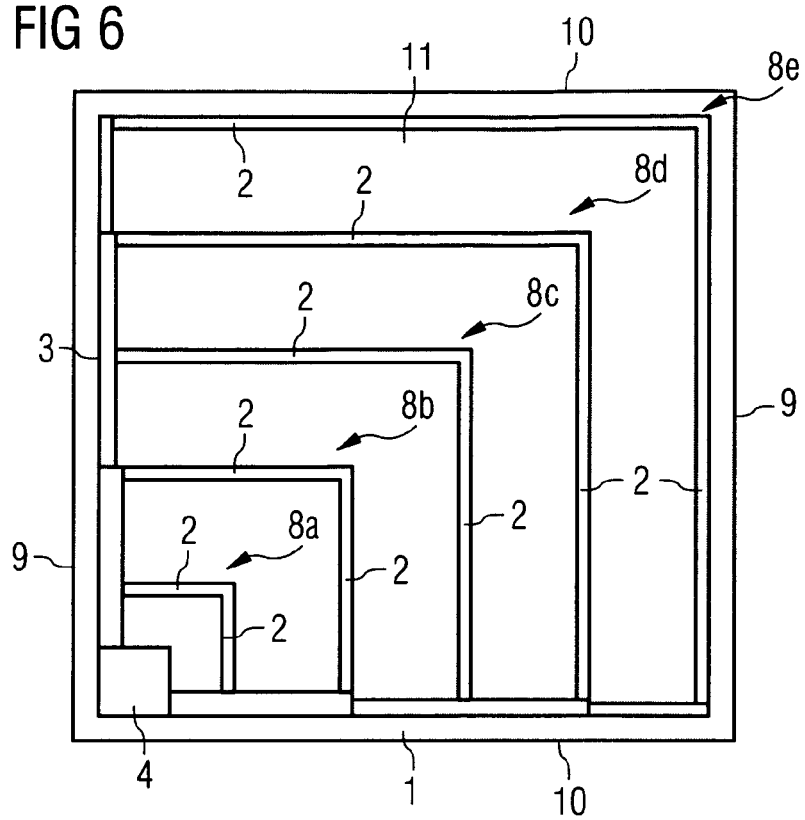
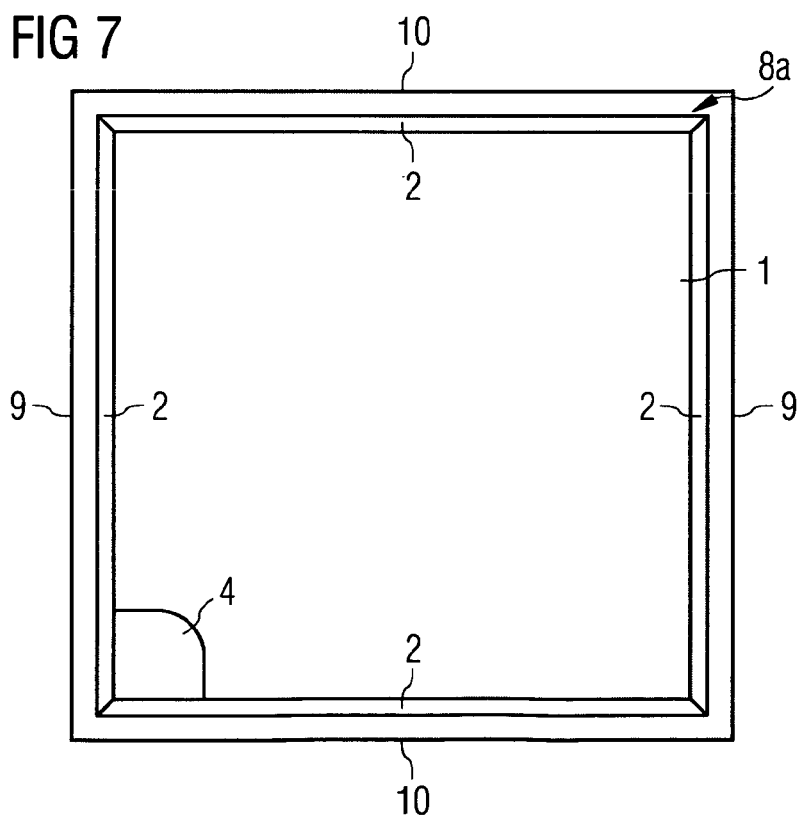

LIGHT-EMITTING DIODE CHIP COMPRISING A CONTACT STRUCTURE

RELATED APPLICATIONS

This is a U.S. national stage of application No. PCT/EP2006/000954, filed on 2 Jun. 2006.

This patent application claims the priority of German patent application no. 10 2005 025 416.0 filed Jun. 2, 2005, the disclosure content of which is hereby incorporated by reference.

FIELD OF THE INVENTION

The invention relates to a luminescence diode chip having a radiation exit area and a contact structure which is arranged on the radiation exit area.

BACKGROUND OF THE INVENTION

In the case of luminescence diode chips which are electrically contact-connected using a bonding wire, a comparatively small central region of the chip surface is generally provided with a contact area (bonding pad) in order to connect the bonding wire. Since luminescence diode chips are generally mounted on a carrier or in an LED housing with a chip surface that is opposite the bonding wire, the chip surface on which the bonding pad is arranged is the radiation exit area, that is to say the chip surface from which at least the predominant part of the electromagnetic radiation generated in an active zone of the luminescence diode chip is coupled out of the luminescence diode chip.

In the case of conventional luminescence diode chips which have an edge length of less than 300 µm, a comparatively homogeneous current distribution can be achieved in the luminescence diode chip using a bonding pad which is centrally arranged on the radiation coupling-out area. However, in the case of large-area luminescence diode chips having an edge length of up to 1 mm, for example, this type of contact-connection may disadvantageously result in inhomogeneous current feed to the luminescence diode chip which results in an increased forward voltage and in low quantum efficiency in the active zone. This effect occurs, in particular, in semiconductor materials having a low transverse conductivity, for example in nitride compound semiconductors. In this case, the maximum current density occurs in a central region of the luminescence diode chip and decreases, starting from the central bonding pad, in the direction of the side flanks as the distance from the bonding pad increases. This results in an often undesirable non-uniform brightness of the radiation exit area. Furthermore, it is disadvantageous that the radiation emitted in the central region of the luminescence diode chip, in which the greatest current density occurs, is at least partially emitted toward the non-transparent bonding pad and is thus at least partially absorbed.

De 199 47 030 A1 discloses the practice of providing the radiation coupling-out area of an InGaAlP LED with a contact structure, which comprises a central bonding pad and a plurality of contact webs which are connected to the bonding pad, in order to achieve better current expansion.

SUMMARY OF THE INVENTION

One object of the invention is to provide a luminescence diode chip having an improved contact structure which is arranged on the radiation exit area and is distinguished, in particular, by reduced absorption of radiation in the bonding pad.

This and other objects are in attained in accordance with one aspect of the present Invention directed to a luminescence diode chip having a radiation exit area and a contact structure which is arranged on the radiation exit area and comprises a bonding pad and a plurality of contact webs which are provided for current expansion and are electrically conductively connected to the bonding pad, the bonding pad is arranged in an edge region of the radiation exit area.

As a result of the fact that the bonding pad is arranged in an edge region of the radiation exit area, the radiation emerging from the luminescence diode chip through a central region of the radiation exit area is advantageously not absorbed in the bonding pad. Arranging the bonding pad in an edge region of the radiation exit area is to be understood as meaning, in particular, that the center point of the bonding pad is at a shorter distance from at least one side flank of the luminescence diode chip than from the center point of the radiation exit area. As a result of the fact that the bonding pad is arranged in an edge region of the radiation exit area, there is advantageously no need to route a bonding wire to the bonding pad via the radiation exit area in contrast to a luminescence diode chip having a bonding pad which is centrally arranged on the radiation exit area. This is particularly advantageous for luminescence diode chips which are operated with comparatively high current intensities, for example more than 300 mA, since, during operation with such high current intensities, there is a need for a comparatively thick bonding wire in which non-negligible absorption of the emitted radiation would occur in the case of an arrangement above the radiation exit area. As a result of the fact that a plurality of contact webs which are electrically conductively connected to the bonding pad are arranged on the radiation exit area, a comparatively homogeneous current distribution can be achieved in the luminescence diode chip despite the bonding pad which is arranged in an edge region of the radiation exit area.

The distance between the bonding pad and at least one side flank of the luminescence diode chip is preferably less than 30 µm. In particular, the bonding pad may also directly adjoin a side flank of the luminescence diode chip.

The bonding pad is advantageously arranged at a corner of the radiation exit area in such a manner that both the distance between the bonding pad and a first side flank of the luminescence diode chip and the distance between the bonding pad and a second side flank of the luminescence diode chip are respectively less than 30 µm. In particular, the bonding pad may adjoin both the first side flank and the second side flank of the luminescence diode chip.

In one preferred variant, at least one contact web runs along a side edge of the luminescence diode chip, the distance from the side edge being less than 15 µm. In particular, the contact web can adjoin the side edge. The short distance from the side edge is advantageous in a luminescence diode chip having a luminescence conversion layer on the radiation exit area. Since the edge region is intended to remain uncovered by the conversion layer in order to be able to detect chip damage during production, for example, the edge region can be advantageously used for current expansion using the arrangement of the contact web.

The contact webs are advantageously arranged on the radiation exit area in such a manner that a current homogeneously flows through an active layer of the luminescence diode chip in such a manner that the radiation exit area of the luminescence diode chip has uniform brightness. In particular, provision is made for the contact webs on the radiation exit area to form a contour of at least one rectangle or at least one square.

The contact webs preferably form the contours of a plurality of rectangles or squares. The plurality of rectangles or squares advantageously respectively have at least one common side edge, particularly preferably even two common side edges. In particular, the contact webs can form the contour of a plurality of squares and/or rectangles which respectively have a common corner point. In this case, in contrast to contact structures in which the contact webs form a plurality of concentric squares or rectangles which are interleaved, there is no need for any connecting webs between the squares and/or rectangles in order to electrically conductively connect the latter to one another.

In one particularly preferred embodiment of the invention, the bonding pad is arranged at a corner point of at least one rectangle or square whose contour is formed by the contact webs. In particular, the bonding pad may be arranged at a common corner point of a plurality of squares and/or rectangles whose contours are formed by the contact webs.

At least more than half of the radiation exit area is advantageously enclosed by the contact webs. This means, for example, that the contact webs form at least one geometrical shape which is intrinsically closed or is at least approximately closed in such a manner that the predominant part of the radiation exit area is enclosed by this geometrical shape. The geometrical shape may be, as in the case of the preferred embodiments described above for example, a polygon, in particular a square or rectangle. It is particularly preferred for the contact webs to enclose more than 80% of the radiation exit area. In particular, provision may be made for the entire radiation exit area to be enclosed by the contact webs.

As a result of the fact that at least the predominant part of the radiation exit area is enclosed by the contact webs, a comparatively homogeneous current distribution can be achieved in the luminescence diode chip despite the bonding pad which is arranged in an edge region of the radiation exit area. As a result of the contact structure which is formed from the bonding pad and the contact webs, a comparatively homogeneous current density and thus correspondingly homogeneous brightness of the radiation exit area are achieved in this manner even in the case of a luminescence diode chip comprising semiconductor materials which have a low transverse conductivity, for example in a luminescence diode chip based on nitride compound semiconductor materials.

In another advantageous refinement of the invention, a luminescence conversion layer is applied to a partial region of the radiation exit area that is enclosed by the contact webs. The luminescence conversion layer contains at least one luminescence conversion material which is suitable for converting the wavelength of at least a part of the radiation emitted by the luminescence diode chip into longer wavelengths. This makes it possible, in particular, to generate white light using a luminescence diode chip, which emits ultraviolet or blue radiation, by converting the wavelength of part of the emitted radiation into the complementary spectral region, for example the yellow spectral region. The luminescence conversion material may be in the form of a fine powder whose particles typically have a particle size in the range from 1 µm to 20 µm. In the present case, the particle size is to be understood as meaning the average diameter of a powder particle. Suitable luminescence conversion materials, for example YAG:Ce, are disclosed in WO 98/12757 whose content is hereby incorporated by reference, in particular as regards phosphors. The luminescence conversion layer is advantageously a plastic layer, preferably a silicone layer, in which the at least one luminescence conversion material is embedded in the form of a matrix. The thickness of the luminescence conversion layer is preferably 10 µm to 50 µm. The luminescence conversion layer is advantageously applied to the radiation exit area of the luminescence diode chip using a screen printing method. An adjustment or patterning accuracy which can be achieved using the screen printing method is approximately 20 µm.

The demands imposed on the adjustment or patterning accuracy in a chip in which the bonding pad is arranged in a corner are advantageously lower than those in a chip in which the bonding pad is centrally arranged, as explained in more detail below in connection with FIGS. 12A and 12B. The optically usable area can also be increased.

Another advantage of a corner arrangement of the bonding pad in combination with a luminescence conversion layer on the radiation exit area exists in the case of an arrangement of a plurality of chips in a wafer assembly. In this case, the bonding pads preferably face one another, with the result that a contiguous area which is not covered by the luminescence conversion layer and is larger than in the case of an individual centrally arranged bonding pad is formed. This is advantageous for patterning and makes it possible to produce the layers in a reproducible manner.

In another preferred embodiment, the luminescence conversion layer is at a distance from the side flanks of the luminescence diode chip. In particular, provision may be made for the luminescence conversion layer to be arranged inside a partial region of the radiation exit area that is enclosed by the contact webs. In this case, the contact webs which are arranged on the radiation exit area form a frame for the luminescence conversion layer. This advantageously reduces the risk of the material of the luminescence conversion layer passing to the side flanks of the luminescence diode chip. This is particularly advantageous when the side flank of the luminescence diode chip is microscopically examined for the purpose of quality control. Such quality control would be rendered more difficult or even impossible by material of the luminescence conversion layer that has been deposited on the side flank of the luminescence diode chip.

According to another variant, the contact structure is in the form of a fork. In this case, a plurality of contact webs run transversely with respect to a contact web and run essentially parallel to one another. A luminescence conversion layer is preferably applied to the radiation exit area between the contact webs.

At least one of the contact webs advantageously has a variable width. The width of the contact web is to be understood as meaning the dimension of the contact web in a direction running perpendicular to its longitudinal direction and parallel to the plane of the radiation exit area. In particular, provision may be made for the contact web having a variable width to contain a plurality of partial regions having a different width. In this case, the width of the partial regions of the contact web is advantageously adapted to a current intensity which occurs when the luminescence diode chip is being operated using the respective partial region of the contact web. The width of the partial regions is, for example, adapted to the current intensity occurring in the respective partial region in such a manner that the current density in the respective partial region does not exceed a limit value, for example 16 A/µm$^2$. Furthermore, the widths of the partial regions of the contact web having a variable width and/or the widths of the further contact webs are preferably dimensioned in such a manner that a minimum current density is not undershot. This advantageously results in the width of the contact webs and/or of the partial regions of the contact web with a variable width at least not being considerably greater than is required for the current carrying capacity. This has the advantage that that partial region of the radiation exit area which is covered by the contact webs is advantageously small and the absorption of the radiation generated by the luminescence diode chip is thus reduced in the contact webs which are arranged on the radiation exit area.

The current distribution in the chip can be distinguished by a lateral current distribution and a vertical current distribution. In the present case, the lateral current distribution is to be understood as meaning the current distribution parallel to the radiation exit area, whereas the vertical current distribution is used to mean the vertical flow of current transverse, preferably perpendicular, to the radiation exit area.

There are various current paths in the chip starting from a current injection point, for instance the bonding pad. A lateral main current path runs along the contact web. This main current path branches into a plurality of auxiliary current paths in the vertical direction. The current paths may be represented in the form of a series circuit of resistances in an equivalent circuit. In one preferred refinement, the contact web is patterned in such a manner that the total resistance along the various current paths is the same as far as possible. The chip may be advantageously energized in a comparatively homogeneous manner as a result.

In another preferred refinement, the width of the contact web increases as the distance from the bonding pad increases. In particular, the contact web may have a plurality of partial regions, the partial region at a greater distance from the bonding pad being broader than the partial region at a shorter distance from the bonding pad. Alternatively, the width of the contact web may increase continuously starting from the bonding pad.

The width of the contact webs is preferably between 10 µm and 40 µm inclusive.

In another advantageous refinement, the luminescence diode chip is a thin-film luminescence diode chip. When producing a thin-film luminescence diode chip, a functional semiconductor layer sequence comprising a radiation-emitting active layer, in particular, is first of all epitaxially grown on a growth substrate, a new carrier is then applied to that surface of the semiconductor layer sequence which is opposite the growth substrate, and the growth substrate is then removed. Since, in particular, the growth substrates used for nitride compound semiconductors, for example SiC, sapphire or GaN, are comparatively expensive, this method affords the advantage, in particular, that the growth substrate can be reused. A sapphire growth substrate can be detached from a semiconductor layer sequence comprising a nitride compound semiconductor using, for example, a laser lift-off method which is disclosed in WO 98/14986.

A basic principle of a thin-film LED is described, for example, in I. Schnitzer et al., Appl. Phys. Lett. 63 (16), Oct. 18, 1993, 2174-2176, the disclosure content of which is hereby incorporated by reference.

In particular, the luminescence diode chip may have an epitaxial layer sequence based on nitride compound semiconductors. In the present context, "based on nitride compound semiconductors" means that the active epitaxial layer sequence or at least one layer of the latter comprises a nitride-III/V compound semiconductor material, preferably $Al_xGa_yIn_{1-x-y}N$, where $0 \leq x \leq 1$, $0 \leq y \leq 1$ and $x+y \leq 1$. In this case, this material need not necessarily have a mathematically exact composition in accordance with the above formula. Rather, it may have one or more dopants as well as additional constituents which essentially do not change the characteristic physical properties of the $Al_xGa_yIn_{1-x-y}N$ material. For the sake of simplicity, however, the above formula comprises only the essential constituents of the crystal lattice (Al, Ga, In, N) even if these can be partially replaced with small amounts of further substances.

The radiation exit area may have a square shape, in particular. In one embodiment of the luminescence diode chip, at least one edge length of the radiation exit area is 400 µm or more, particularly preferably 800 µm or more. In particular, even an edge length of 1 mm or more may be provided. On account of the current expansion by the contact webs which are arranged on the radiation exit area, a comparatively homogeneous current distribution can be achieved in the active layer even in the case of such large-area luminescence diode chips.

The contact structure which is formed from the bonding pad and the contact webs is particularly advantageous for luminescence diode chips which are operated with a current intensity of 300 mA or more since, with such high operating current intensities, an inhomogeneous current distribution which would have a maximum in a central region of the luminescence diode chip that is provided with the bonding pad could be observed in conventional luminescence diode chips.

The contact structure preferably contains a metal or a metal alloy. The contact structure is preferably a patterned Ti—Pt—Au layer sequence which, starting from an adjoining semiconductor layer of the luminescence diode chip, comprises a Ti layer having a thickness of approximately 50 nm, a Pt layer having a thickness of approximately 50 nm and an Au layer having a thickness of approximately 2 µm, for example. A Ti—Pt—Au layer sequence is advantageously insensitive to electromigration which could otherwise occur, for example in the case of a contact structure containing aluminum. The contact structure is therefore preferably free of aluminum.

Furthermore, the contact structure, in particular the Ti layer, may be formed in such a manner that the radiation generated by the chip is absorbed. This makes it possible to reduce waveguide effects which result in the emission of radiation outside the regions covered by the conversion layer.

Only less than 15%, particularly preferably less than 10%, of the radiation exit area is advantageously covered by the contact structure. The absorption losses inside the contact structure are thus advantageously low.

In another preferred embodiment, the luminescence diode chip contains a semiconductor layer sequence having an active layer, a reflective contact layer being provided on a main area of the semiconductor layer sequence that is opposite the radiation exit area. A region of the main area that is opposite the bonding pad is advantageously spared from the reflective contact layer.

The contact layer which is opposite the radiation exit area, as seen from the active layer, is thus patterned in such a manner that a region of the main area that is not covered by the contact layer is opposite the bonding pad in the vertical direction, as seen from the active layer. This has the advantage that the current density is reduced in a region of the active layer that is under the bonding pad in the vertical direction, with the result that less radiation is generated under the bonding pad. Furthermore, as a result of the reflective contact layer being spared, that proportion of the emitted radiation which is reflected in the direction of the bonding pad by the reflective contact layer is reduced. This reduces the absorption of radiation in the bonding pad. The efficiency of the luminescence diode chip is thus advantageously increased.

If the radiation exit area of the luminescence diode chip is partially provided with a luminescence conversion layer, as described above, a region—which is opposite the luminescence conversion layer as seen from the active layer—of that main area of the semiconductor layer sequence which is opposite the contact structure is advantageously spared from the reflective contact layer. This reduces the generation of radiation in those regions of the active layer which are arranged in the lateral direction such that they are offset with respect to the luminescence conversion layer arranged on the radiation exit area. Furthermore, that proportion of the emitted radiation which is reflected by the reflective contact layer into that partial region of the radiation exit area which is not provided with the luminescence conversion layer is thus reduced.

In the case of a chip which emits short-wave radiation, Ag is preferably used for the reflective contact layer. This may result in electromigration, in particular in the case of damage to the edge of the chip and the ingress of moisture. Electromigration may result in shunts which adversely affect the aging stability of the chip. In the case of the invention, such damage is counteracted by distancing the contact layer from the side edge.

BRIEF DESCRIPTION OF THE DRAWINGS

FIG. 6 shows a diagrammatic illustration of a plan view of the radiation exit area of a luminescence diode chip according to a sixth exemplary embodiment of the invention, FIG. 7 shows a diagrammatic illustration of a plan view of the radiation exit area of a luminescence diode chip according to a seventh exemplary embodiment of the invention.

DETAILED DESCRIPTION OF THE INVENTION

Identical or identically acting elements are provided with the same reference symbols in the figures. The elements illustrated should not be considered to be true to scale but rather individual elements may be illustrated in an excessively large manner for the sake of better understanding.

Figure 1A:
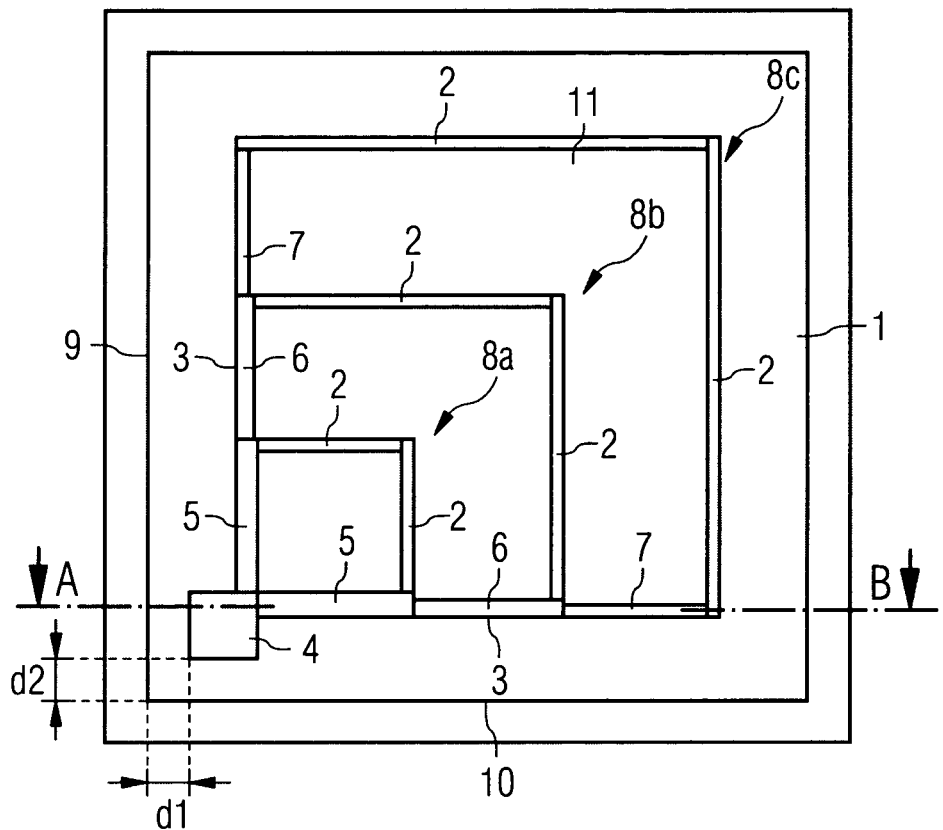
FIG. 1A shows a diagrammatic illustration of a plan view of a luminescence diode chip according to a first exemplary embodiment of the invention.
Figure 1B:
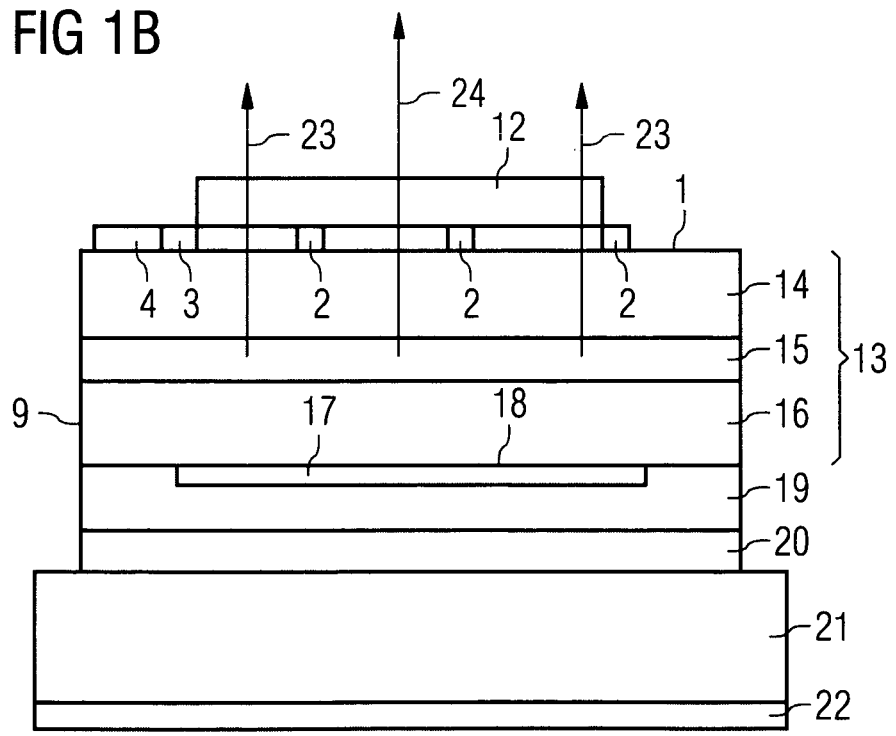
FIG. 1B shows a diagrammatic illustration of a cross section along the line AB of the exemplary embodiment illustrated in FIG. 1A.

A first exemplary embodiment of a luminescence diode chip according to the invention is diagrammatically illustrated in a plan view in FIG. 1A and in cross section in FIG. 1B. The luminescence diode chip contains a semiconductor layer sequence 13 which is produced epitaxially, for example, preferably using MOVPE (metalorganic vapor phase epitaxy). The semiconductor layer sequence 13 contains a radiation-emitting active layer 15.

The active layer 15 of the luminescence diode chip comprises, for example, $In_xAl_yGa_{1-x-y}N$, where $0 \le x \le 1$, $0 \le y \le 1$ and $x+y \le 1$. The active layer 15 may be in the form of a hetero structure, a double hetero structure or a quantum well structure, for example. In this case, the term "quantum well structure" includes any structure in which charge carriers experience quantization of their energy states as a result of confinement. In particular, the term "quantum well structure" does not contain an indication of the dimensionality of the quantization. It thus comprises, inter alia, quantum wells, quantum wires and dots and any combination of these structures.

Electromagnetic radiation 23, for example radiation in the ultraviolet, blue or green spectral region, is emitted from the active layer 15 in a main radiation direction 24. The active layer 15 is arranged, for example, between at least one n-conducting semiconductor layer 14 and at least one p-conducting semiconductor layer 16. The radiation 23 emitted from the active layer 15 is coupled out of the luminescence diode chip at a radiation exit area 1.

In order to inject current into the active layer 15, a contact structure 2, 3, 4 is provided on the radiation exit area 1. The contact structure 2, 3, 4 on the radiation exit area 1 is formed by a bonding pad 4 and a plurality of contact webs 2, 3 which are electrically conductively connected to the bonding pad 4. The contact structure 2, 3, 4 preferably contains a metal or a metal alloy. In particular, the contact structure 2, 3, 4 may be formed from a patterned Ti—Pt—Au layer sequence (not illustrated). The patterning methods which are known to a person skilled in the art, in particular the application of a mask in conjunction with a subsequent etching process, may be used for patterning. The Ti—Pt—Au layer sequence from which the contact structure 2, 3, 4 is preferably produced contains a Ti layer having a thickness of approximately 50 nm, a Pt layer having a thickness of approximately 50 nm and an Au layer having a thickness of approximately 2 μm, for example. Such a Ti—Pt—Au layer sequence is advantageously insensitive to electromigration which could otherwise occur, for example in the case of a contact structure containing aluminum. For this reason, the contact structure is preferably free of aluminum.

The luminescence diode chip is preferably a thin-film luminescence diode chip. The semiconductor layer sequence 13 has been produced, for example, on a growth substrate which was originally arranged on a surface of the semiconductor layer sequence 13 facing the radiation exit area 1 and was then detached, for example using a laser lift-off method disclosed in WO 98/14986. The semiconductor layer sequence 13 is fastened to a carrier 21 on a side of the active layer 15 that is opposite the radiation exit area 1 and thus the original growth substrate. For example, the semiconductor layer sequence 13 is fastened to the carrier 21 by means of a connecting layer 20 which may be a solder layer, in particular. The carrier 21 is, for example, a circuit board, in particular a printed circuit board. Furthermore, the carrier 21 may be formed from a ceramic which may contain aluminum nitride, in particular. It is also possible to use carriers comprising a semiconductor material, for example Ge or GaAs carriers. A rear side of the carrier 21 that faces away from the semiconductor layer sequence 13 is provided, for example, with an electrical contact layer 22 which forms a second electrical contact of the luminescence diode chip that is opposite the contact structure 2, 3, 4, as seen from the active layer 15.

The bonding pad 4 of the contact structure that is arranged on the radiation exit area 1 is arranged in an edge region of the radiation exit area 1. The distance $d_1$ between a side flank 9 of the luminescence diode chip and the bonding pad 4 is preferably less than 30 μm. As can be seen in the plan view illustrated in FIG. 1, the bonding pad 4 is particularly preferably arranged in the region of a corner of the radiation exit area 1. In this case, the distance $d_1$ between the bonding pad 4 and a first side flank 9 of the luminescence diode chip and the distance $d_2$ between the bonding pad and a second side flank 10 of the luminescence diode chip are preferably respectively 30 μm or less. Such an arrangement of the bonding pad in an edge region of the radiation exit area 1 has the advantage that absorption of the electromagnetic radiation 23 generated in the active layer 15 is reduced in the bonding pad 4.

In order to achieve a current distribution which is homogeneous in the lateral direction in the active layer 15 despite the bonding pad 4 being arranged in an edge region of the radiation exit area 1, a plurality of contact webs 2, 3 which are respectively electrically conductively connected to the bonding pad 4 are arranged on the radiation exit area 1. For example, as can be seen in the plan view in FIG. 1A, a plurality of contact webs 2, 3 are arranged on the radiation exit area 1 in such a manner that they form the contour of a plurality of squares 8a, 8b, 8c. The squares 8a, 8b, 8c formed by the contact webs 2, 3 advantageously respectively have two common side edges which are each formed by a contact web 3. In this case, the bonding pad 4 is arranged at a common corner point of the squares 8a, 8b and 8c.

The contact structure formed from the bonding pad 4 and the contact webs 2, 3 gives rise, on the one hand, to a largely homogeneous lateral current distribution in the active layer 15, only such a small part of the radiation exit area 1 being covered by the contact structure 2, 3, 4 that only comparatively little radiation 23 emitted from the active layer 15 in the main radiation direction 24 is absorbed inside the contact structure 2, 3, 4. At least one partial region 11 of the radiation exit area 1 is advantageously enclosed by the contact webs 2, 3. For example, as can be seen in the plan view in FIG. 1A, a partial region 11 of the radiation exit area 1, which in this case is arranged inside an outer square 8c, is enclosed by the contact webs 2, 3. The area of the partial region 11 thus includes the area of the outer square 8c including the inner squares 8a, 8b which are arranged in the latter. In one preferred embodiment, more than 50%, particularly preferably even more than 80%, of the radiation exit area 1 is enclosed by the contact webs 2, 3.

In another preferred embodiment, at least one of the contact webs has a variable width. The width of this contact web is not constant in its main direction of extent but rather varies in a stepwise manner or continuously. In the exemplary embodiment illustrated in FIG. 1, the two contact webs 3 which start from the bonding pad 4 are each composed of three partial regions 5, 6, 7 each having different widths, for example. The widths of the contact webs 3 in the partial regions 5, 6, 7 are advantageously respectively adapted to a current intensity which occurs when the luminescence diode chip is being operated using the respective partial region 5, 6, 7. The widths of the partial regions 5, 6, 7 are preferably adapted to the current intensities which occur during operation in such a manner that the cross-sectional area of the contact webs is dimensioned such that the current density occurring during operation does not exceed a material-dependent permissible limit value, but, on the other hand, the cross-sectional area is at least not considerably larger than that required by the respective current intensity in order to avoid unnecessary absorption losses in the contact webs. For example, the current intensity in those partial regions 5 of the contact webs 3 which adjoin the bonding pad is greater than in the adjoining partial regions 6 and the current intensity in the partial regions 6 is in turn greater than in the adjoining partial regions 7. Consequently, the width of the contact webs 3 in the partial regions 5 is greater than in the partial regions 6 and the width of the contact webs in the partial regions 6 is greater than in the partial regions 7.

In one preferred embodiment, a luminescence conversion layer 12 is applied to that partial region 11 of the radiation exit area 1 which is enclosed by the contact webs 2, 3. The luminescence conversion layer 12 is, for example, a silicone layer in which at least one luminescence conversion material is embedded. The at least one luminescence conversion material may be, for example, YAG:Ce or another luminescence conversion material disclosed in WO 98/12757.

For example, the wavelength of at least one part of the radiation 23 which is emitted from the active layer 15 and is, for example, green, blue or ultraviolet light is converted into a complementary spectral region using the luminescence conversion material in such a manner that white light is produced. The use of a silicone layer as the carrier layer for the luminescence conversion material has the advantage that silicone is comparatively insensitive to short-wave blue or ultraviolet radiation. This is particularly advantageous for luminescence diode chips which are based on nitride compound semiconductors and in which the emitted radiation generally contains at least one portion of the short-wave blue or ultraviolet spectral region. Alternatively, another transparent organic or inorganic material can also function as the carrier layer for the at least one luminescence conversion material.

The luminescence conversion layer 12 which is advantageously applied to the radiation exit area 1 inside a partial region 11 framed by the contact webs 2, 3 does not, in particular, adjoin one of the side flanks 9, 10 of the luminescence diode chip. In particular, this reduces the risk of the material of the luminescence conversion layer also being deposited onto the side flanks 9, 10 when applying the luminescence conversion layer 12. Depositing the material of the luminescence conversion layer 12 onto the side flanks 9, 10 would have the disadvantage, in particular, that quality control of a fully processed luminescence diode chip, which quality control is generally carried out by microscopically examining one of the side flanks 9, 10 of the luminescence diode chip, would be rendered more difficult or even impossible.

The luminescence conversion layer 12 is applied to the partial region 11 of the radiation exit area 1 using a printing method, in particular using a screen printing method, for example. The thickness of the luminescence conversion layer 12 is typically approximately 10 μm to 20 μm.

A contact layer 17 which preferably establishes ohmic contact with the adjoining semiconductor layer 16 advantageously adjoins that main area 18 of the semiconductor layer sequence 13 of the luminescence diode chip which faces the carrier 21. The contact layer 17 preferably contains a metal, for example aluminum, silver or gold. In the case of a p-conducting nitride compound semiconductor layer 16 which adjoins the second contact layer 15, silver, in particular, is a suitable material for the contact layer 17 since silver establishes good ohmic contact with p-conducting nitride compound semiconductors.

The contact layer 17 is preferably a layer that reflects the emitted radiation 23. This has the advantage that at least part of electromagnetic radiation emitted by the active layer 15 in the direction of the carrier 21 is reflected toward the radiation exit area 1 and is coupled out of the luminescence diode chip there. This reduces absorption losses which could occur, for example, inside the carrier 21 or in the connecting layer 20.

A region of the main area 18 that is opposite the bonding pad 4 is preferably spared from the contact layer 17. Since no ohmic contact is established between the contact layer 17 and the adjoining semiconductor layer 16 in the region which has been spared, the flow of current between the contact structure 2, 3, 4 on the radiation exit area 1 and the electrical contact layer 22 on the rear side of the carrier 21 is reduced in that region of the semiconductor layer sequence 13 which is offset with respect to the contact layer 17 in the lateral direction. The generation of radiation is thus reduced in this region of the active layer 15, as a result of which the absorption of radiation inside the bonding pad 4 is advantageously reduced.

A barrier layer 19 is preferably included between the reflective contact layer 17 and the connecting layer 20. The barrier layer 19 contains TiWN, for example. The barrier layer 19 prevents, in particular, diffusion of material of the connecting layer 20, which is a solder layer for example, into the reflective contact layer 17, which could impair, in particular, the reflection of the reflective contact layer 17.

A region of that main area 18 of the semiconductor layer sequence 13 which is displaced In the lateral direction from the luminescence layer 12 is advantageously spared from the reflective contact layer 17. This reduces the generation of radiation in those regions of the active layer 15 which are arranged in the lateral direction such that they are offset with respect to the luminescence conversion layer 12 arranged on the radiation exit area. Furthermore, that proportion of the emitted radiation which is reflected by the reflective contact layer 17 into that partial region of the radiation exit area 1 which is not provided with the luminescence conversion layer 12 is thus reduced.

Alternative refinements of the contact structure which is applied to the radiation exit area 1 and comprises the bonding pad 4 and the contact webs 2, 3 are explained below using the exemplary embodiments illustrated in FIGS. 2 to 8. In this case, only the plan view of the radiation exit area 1 of the luminescence diode chip is respectively shown. In cross section, the respective luminescence diode chips can have the same structure, for example, as the first exemplary embodiment illustrated in cross section in FIG. 1B. Furthermore, the luminescence diode chip may also have, however, any other desired embodiment known to a person skilled in the art. In particular, the luminescence diode chip need not necessarily be a thin-film luminescence diode chip.

Figure 2:
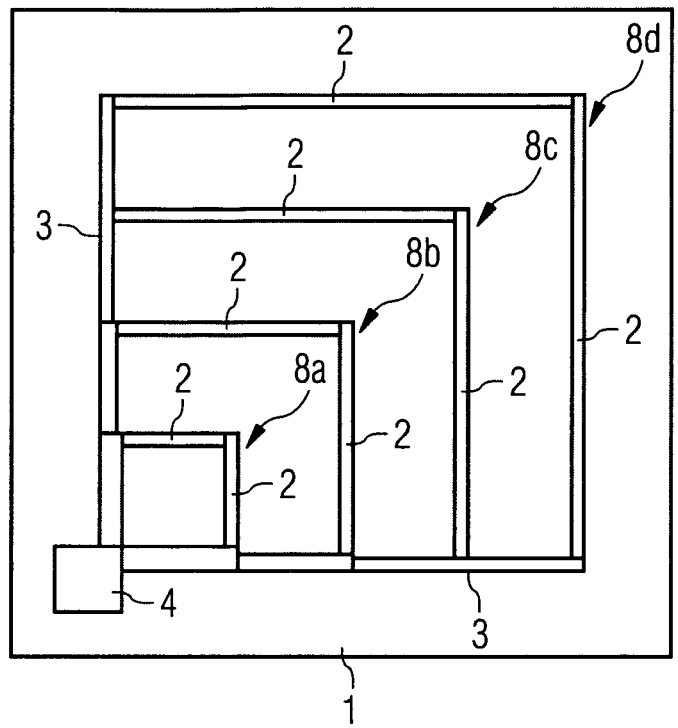
FIG. 2 shows a diagrammatic illustration of a plan view of the radiation exit area of a luminescence diode chip according to a second exemplary embodiment of the invention.
Figure 3:
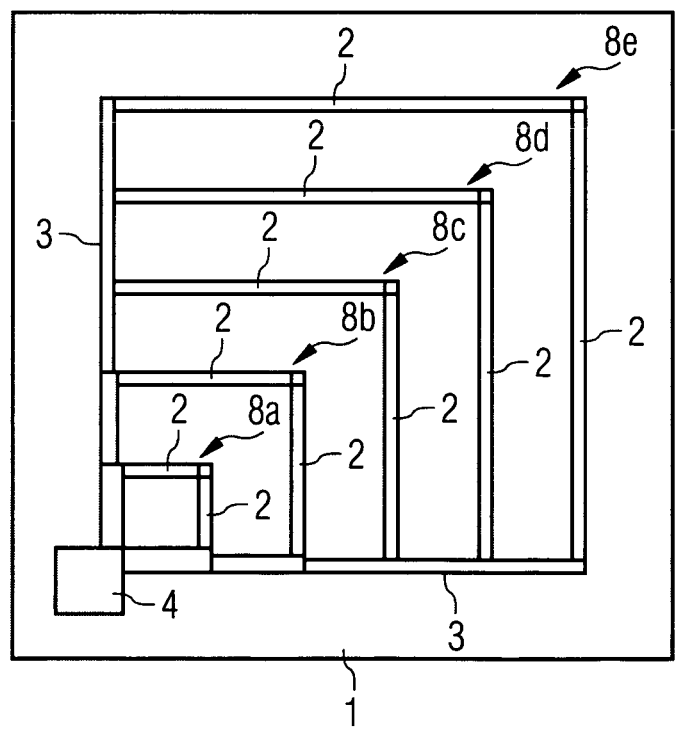
FIG. 3 shows a diagrammatic illustration of a plan view of the radiation exit area of a luminescence diode chip according to a third exemplary embodiment of the invention.
Figure 4:
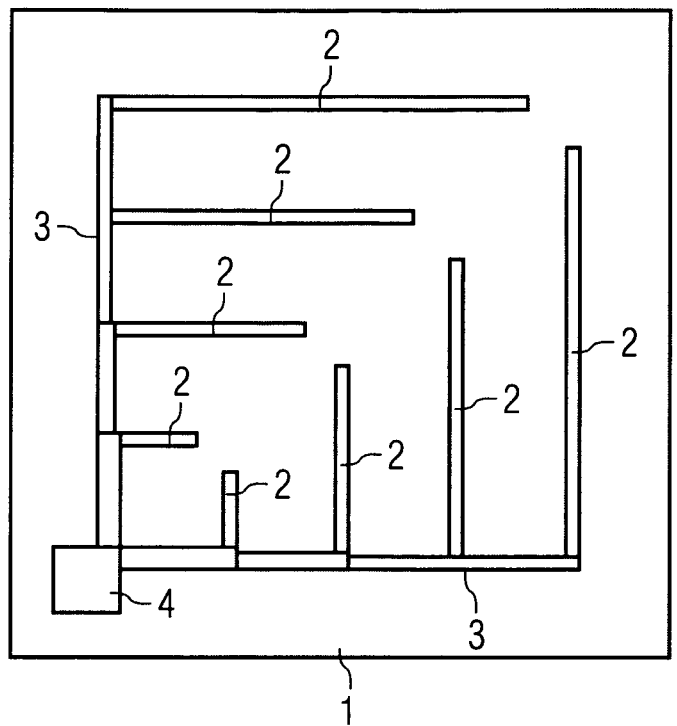
FIG. 4 shows a diagrammatic illustration of a plan view of the radiation exit area of a luminescence diode chip according to a fourth exemplary embodiment of the invention.

The contact structures illustrated in FIGS. 2 and 3 differ from the contact structure of the first exemplary embodiment that is illustrated in FIG. 1A by virtue of the fact that the number of squares whose contour is formed by the contact webs 2, 3 has been increased.

In the contact structure illustrated in FIG. 2, the contact webs 2, 3 form four interleaved squares 8a, 8b, 8c, 8d. As in the first exemplary embodiment, the interleaved squares respectively have two common side edges 3 and the bonding pad 4 is arranged at a common corner point of the squares 8a, 8b, 8c, 8d.

In the exemplary embodiment illustrated in FIG. 3, the contact structure comprises five interleaved squares 8a, 8b, 8c, 8d, 8e. The number of contact webs 2, 3 required depends, in particular, on the size of the radiation exit area 1 and on the transverse conductivity of the underlying semiconductor material.

The structures on the radiation exit area 1 which are formed from the contact webs 2, 3 need not necessarily be intrinsically closed geometrical structures. For example, in the exemplary embodiment illustrated in FIG. 4, starting from two contact webs 3 which start from the bonding pad and have a variable width, a plurality of further contact webs 2 are routed over the radiation exit area in the form of fingers but are not connected to one another to form squares.

Figure 5:
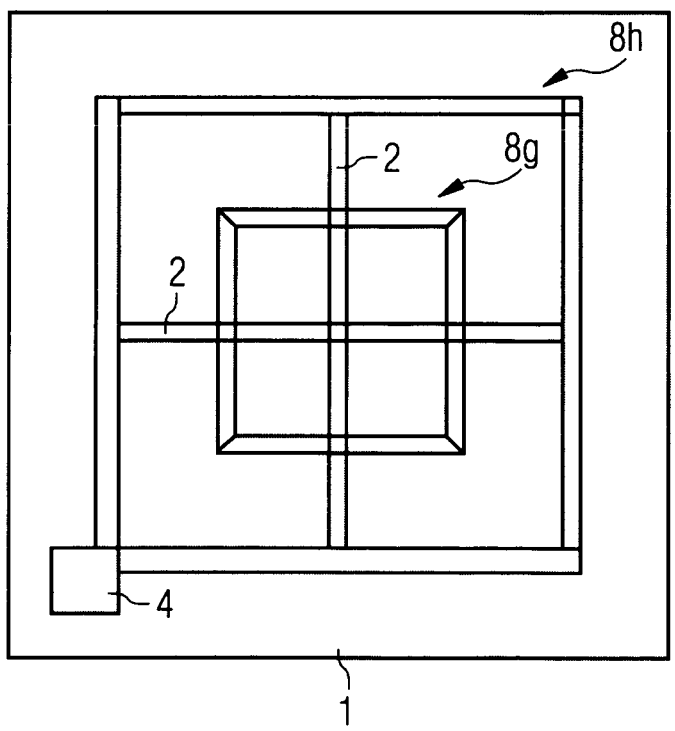
FIG. 5 shows a diagrammatic illustration of a plan view of the radiation exit area of a luminescence diode chip according to a fifth exemplary embodiment of the invention.

The exemplary embodiment of a contact structure that is illustrated in FIG. 5 differs from the exemplary embodiments described above by virtue of the fact that the contact structure is not formed from interleaved squares having two common side edges but rather is formed by two concentric squares 8g, 8h which are electrically conductively connected to one another by means of two contact webs 2 which run through the center of the squares 8g, 8h.

Like in the exemplary embodiment illustrated in FIG. 3, in the exemplary embodiment illustrated in FIG. 6, the contact structure is formed from five interleaved squares 8a, 8b, 8c, 8d, 8e each having two common side flanks formed by contact webs 3 having a variable width. In contrast to the exemplary embodiment illustrated in FIG. 3, in the exemplary embodiment illustrated in FIG. 6, the bonding pad 4 is arranged at a common corner point of the squares 8a, 8b, 8c, 8d, 8e formed by the contact webs 2, 3 in such a manner that it is completely arranged inside the squares formed by the contact webs. The bonding pad 4 has the shape of a square in which two side flanks respectively correspond to the two common side flanks of the squares 8a, 8b, 8c, 8d, 8e formed by the contact webs. In this embodiment, the distance between the contact webs, which form the outer square 8e, and the side flanks 9, 10 of the luminescence diode chip is comparatively short. In particular, that partial region 11 of the radiation exit area 1 which is enclosed by the outer square 8a may comprise more than 80% of the radiation exit area 1. This is particularly advantageous if a luminescence conversion layer is applied to the partial region 11 of the radiation exit area 1 since virtually the entire radiation exit area 1 can be used in this manner to generate white light using luminescence conversion.

In comparison with the exemplary embodiment illustrated in FIG. 6, the exemplary embodiment illustrated in FIG. 7 does not provide any contact webs which are arranged inside the square 8a. In this case, the contact structure is formed solely by the bonding pad 4 and the contact webs 2 which are routed over the radiation exit area 1 along the side flanks 9, 10 of the luminescence diode chip at a short distance, preferably less than 30 μm. The bonding pad 4 need not necessarily have a square shape as in the exemplary embodiments described above. Rather, it may have a rounded corner or else another geometrical shape, as illustrated in FIG. 7, for example.

Figure 8:
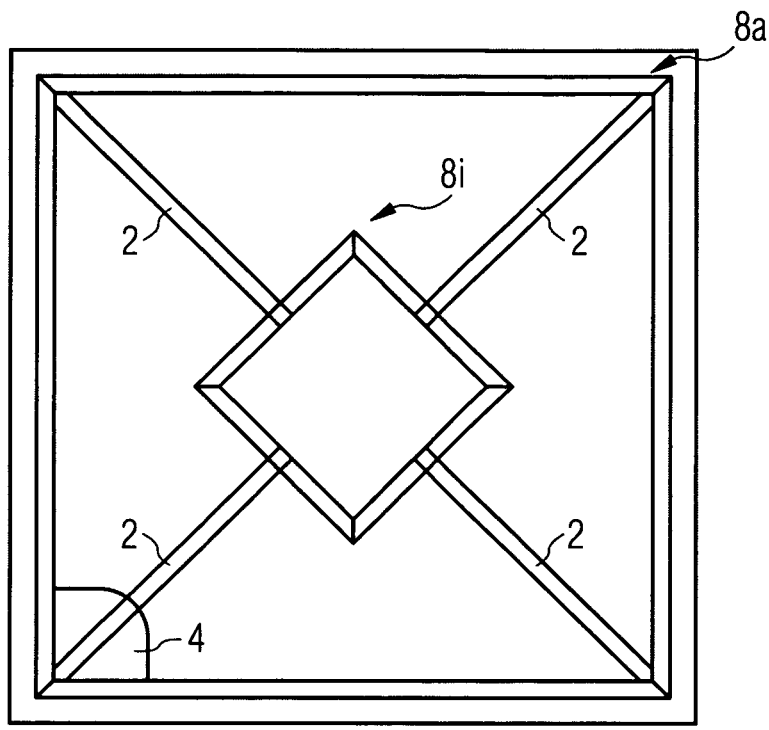
FIG. 8 shows a diagrammatic illustration of a plan view of the radiation exit area of a luminescence diode chip according to an eighth exemplary embodiment of the invention.

The exemplary embodiment of a contact structure that is illustrated in FIG. 8 essentially corresponds to the exemplary embodiment illustrated in FIG. 7, in which case an inner square 8i is additionally formed by four contact webs in a central region of the radiation exit area 1, said contact webs respectively being connected to the corner points of an outer square 8a using connecting webs. This exemplary embodiment illustrates that, in the case of the contact structure formed from a plurality of contact webs, the contact webs need not necessarily run perpendicular to one another. Rather, a plurality of contact webs may also enclose any other desired angles, for example 45° angles, with one another. Alternatively, it is also conceivable for the contact webs to form curved geometrical shapes, for example circles.

Figure 9:
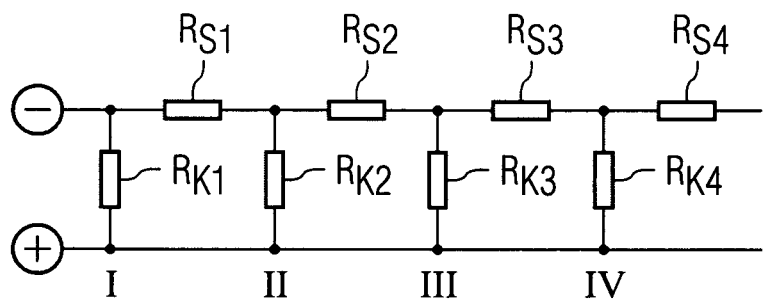
FIG. 9 shows an equivalent circuit diagram of a section of a luminescence diode chip according to the invention.

The equivalent circuit shown in FIG. 9 has a series circuit of resistances $R_{S1}$ to $R_{S4}$, $R_{S1}$ being connected to a negative reference potential. The nodes of this circuit are respectively connected to a positive reference potential by means of a resistance $R_{K1}$ to $R_{K4}$. In this case, the negative reference potential may correspond to the bonding pad and the positive reference potential may correspond to the contact layer 22 (see FIG. 1B). The series circuit of the resistances $R_{S1}$ to $R_{S4}$ essentially reproduces the lateral current distribution in the n-conducting semiconductor layer 14 (see FIG. 1B), whereas the vertical flow of current in the chip is modeled using the resistances $R_{K1}$ to $R_{K4}$.

The following considerations are based on the aim of using a suitable selection of the resistances $R_{S1}$ to $R_{S4}$ and $R_{K1}$ to $R_{K4}$ to achieve a homogeneous current distribution in the chip.

For this purpose, the total resistances $R_{II}$ and $R_{IV}$ at the two nodes II and IV are compared with one another. The total resistances $R_{II}$ and $R_{IV}$ are a sum of the individual resistances along the different current paths. Thus, $R_{II}=R_{S1}+R_{K2}$ and $R_{IV}=R_{S1}+R_{S2}+R_{S3}+R_{K4}$.

Both the resistances $R_{S1}$ to $R_{S4}$ and the resistances $R_{K1}$ to $R_{K4}$ depend on the width of the contact webs. Various widths are examined below:

A) Contact Web Width b

If the contact web has a constant width b, the following applies: $R_{S1}=R_{S2}=R_{S3}=R_{S4}=R_S$ and $R_{K1}=R_{K2}=R_{K3}=R_{K4}=R_K$. This results in the following for the resistances $R_{II}$ and $R_{IV}$: $R_{II}=R_S+R_K$ and $R_{IV}=3R_{S+RK}$.

B) Contact Web Width 2b

If the contact web has a constant width 2b, the following applies: $R_{S1}=R_{S2}=R_{S3}=R_{S4}=0.5\ R_S$ and $R_{K1}=R_{K2}=R_{K3}=R_{K4}=0.5\ R_K$. This results in the following for the resistances $R_{II}$ and $R_{IV}$: $R_{II}=0.5\ R_S+0.5\ R_K$ and $R_{IV}=3*0.5\ R_S+0.5\ R_K$.

C) Decreasing Contact Web Width

The contact web has a partial region of the contact web width 2b and a partial region of the contact web width b, with the result that the following applies: $R_{S1}=R_{S2}=0.5\ R_S$ and $R_{S3}=R_{S4}=R_S$ (contact web width b) and $R_{K1}=R_{K2}=0.5\ R_K$ (contact web width 2b) and $R_{K3}=R_{K4}=R_K$ (contact web width b). This results in the following for the resistances $R_{II}$ and $R_{IV}$: $R_{II}=0.5\ R_S+0.5\ R_K$ and $R_{IV}=2*0.5\ R_S+R_S+R_K$.

D) Increasing Contact Web Width

The contact web has a partial region of the width b and a partial region of the width 2b, with the result that the following applies: $R_{S1}=R_{S2}=R_S$ (contact web width b) and $R_{S3}=R_{S4}=0.5\ R_S$ (contact web width 2b) and $R_{K1}=R_{K2}=R_K$ (contact web width b) and $R_{K3}=R_{K4}=0.5\ R_K$ (contact web width 2b). This results in the following for the resistances $R_{II}$ and $R_{IV}$: $R_{II}=R_S+R_K$ and $R_{IV}=2R_S+0.5\ R_S+0.5\ R_K$.

If $R_S=R_K$, $R_{II}/R_{IV}=\frac{1}{2}$ in the case of A), $R_{II}/R_{IV}=\frac{1}{2}$ in the case of B), $R_{II}/R_{IV}=\frac{1}{3}$ in the case of C) and $R_{II}/R_{IV}=\frac{2}{3}$ in the case of D).

If $R_S>>R_K$, $R_{II}/R_{IV}=\frac{1}{3}$ in the case of A), $R_{II}/R_{IV}=\frac{1}{3}$ in the case of B), $R_{II}/R_{IV}=\frac{1}{4}$ in the case of C) and $R_{II}/R_{IV}=\frac{2}{5}$ in the case of D).

If $R_S<<R_K$, $R_{II}/R_{IV}=1$ in the case of A), $R_{II}/R_{IV}=1$ in the case of B), $R_{II}/R_{IV}=\frac{1}{2}$ in the case of C) and $R_{II}/R_{IV}=2$ in the case of D).

A ratio of $R_{II}/R_{IV}=1$ is preferred for a homogenous current distribution. This is because, in the case of $R_{II}/R_{IV}>1$, a higher luminance occurs further away from the bonding pad, whereas, in the case of $R_{II}/R_{IV}<1$, a higher luminance occurs at the bonding pad, both of which are not favored. The variant D), that is a contact web width that increases starting from the bonding pad, is thus the preferred refinement for $R_S=R_K$ and $R_S>>R_K$. In the case of $R_S=R_K$ and $R_S>>R_K$, the conductivity of the contact web is limited.

Figure 10:
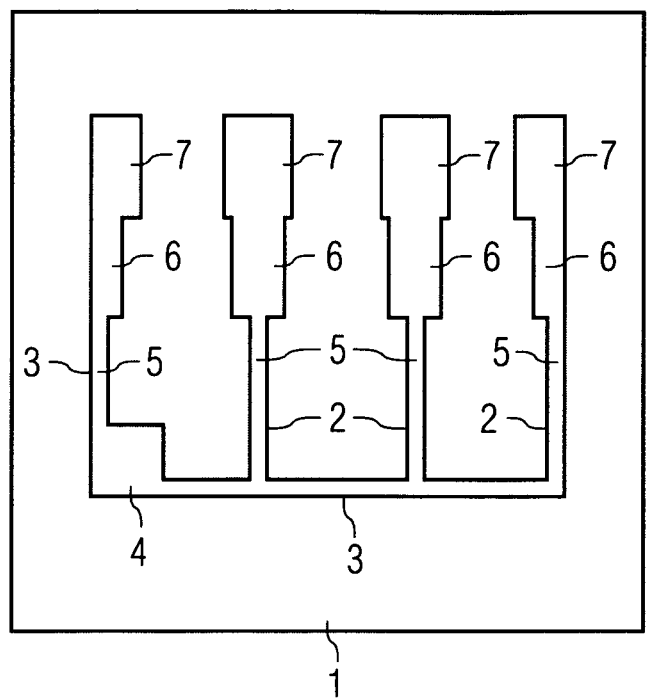
FIG. 10 shows a diagrammatic illustration of a plan view of the radiation exit area of a luminescence diode chip according to a ninth exemplary embodiment of the invention.

The luminescence diode chip which is illustrated in a plan view in FIG. 10 has a contact structure comprising a bonding pad 4 and contact webs 2, 3 on the radiation exit area 1. The contact webs 2 and at least one of the contact webs 3 have an increasing contact web width, which is favored according to the statements above. Such a selection of the contact web width can be used to achieve a comparatively homogeneous current distribution over the radiation exit area 1.

The contact webs 2 and at least one of the contact webs 3 have partial regions 5, 6 and 7, the partial region 7 being broader than the partial region 5.

In addition to the illustrated structure of the contact webs 2, 3 in the form of a fork, refinements in which, for example, a further contact web connects the separate partial regions 7 are also conceivable. Furthermore, it is conceivable for the contact web 3, from which the contact webs 2 branch off, to likewise be subdivided into the partial regions 5, 6 and 7.

Figure 11:
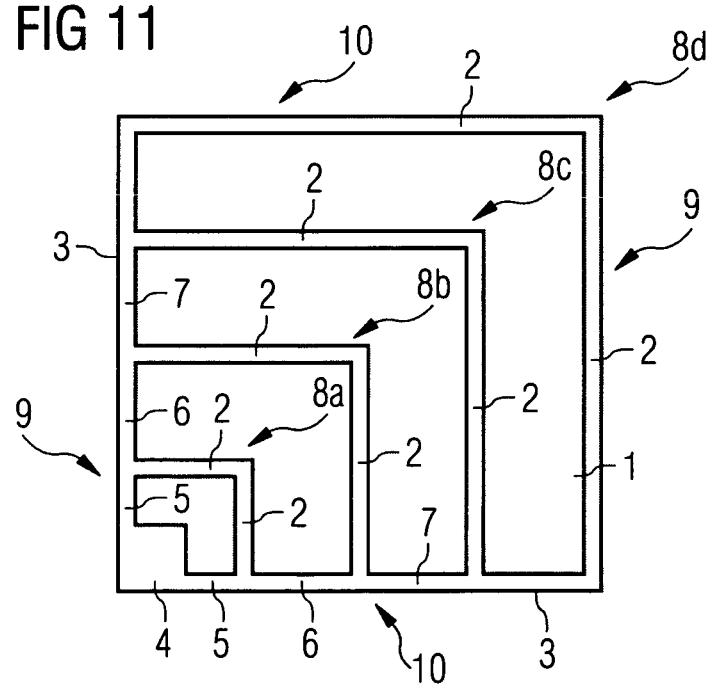
FIG. 11 shows a diagrammatic illustration of a plan view of the radiation exit area of a luminescence diode chip according to a tenth exemplary embodiment of the invention.

FIG. 11 illustrates a plan view of another exemplary embodiment of a luminescence diode chip according to the invention.

The bonding pad 4 of the contact structure, which is arranged on the radiation exit area 1, is arranged in a corner of the radiation exit area 1. Two side edges of the bonding pad 4 preferably coincide with two side edges 9 and 10 of the chip. The contact webs 3 particularly preferably extend along the side edges 9 and 10. This has the advantage that the edge region does not remain unused but rather is used for current expansion. The contact webs 3 form, with the contact webs 2, the outline of a plurality of squares 8a, 8b, 8c, 8d.

Figure 12A:
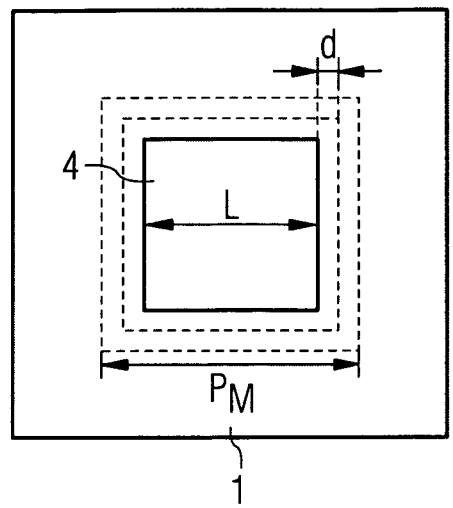
FIG. 12A shows a diagrammatic illustration of a central arrangement of the bonding pad.
Figure 12B:
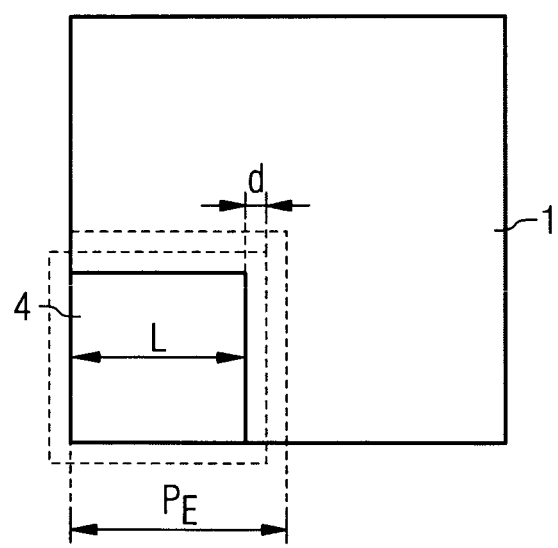
FIG. 12B shows a diagrammatic illustration of a corner arrangement of the bonding pad.

FIGS. 12A and 12B shall be used below to explain why the demands imposed on the adjustment accuracy are lower in a chip with a corner arrangement of the bonding pad than in a chip with a central arrangement of the bonding pad.

As illustrated in FIG. 12A, a length $P_M=L+4d$ which is required for application results for the case in which the bonding pad is centrally arranged with an actual length L of the bonding pad 4. In this case, d is the adjustment accuracy which can be achieved when applying the luminescence conversion layer.

In contrast, the length required for application is $P_E=L+2d$ in the case of a corner arrangement of the bonding pad 4.

The demands imposed on the adjustment accuracy are thus reduced by a factor of 2 in the case of a corner arrangement with the same bonding pad size.

The invention is not restricted by the description using the exemplary embodiments. Rather, the invention includes any new feature and any combination of features, which comprises, in particular, any combination of features in the patent claims, even if this feature or this combination itself is not explicitly specified in the patent claims or exemplary embodiments.

The invention claimed is:

1. A luminescence diode chip having:
   a radiation exit area, and
   a contact structure which is arranged on the radiation exit area and comprises a bonding pad and a plurality of contact webs,
   wherein the contact webs are provided for current expansion and are electrically conductively connected to the bonding pad,
   wherein the bonding pad is arranged in an edge region of the radiation exit area, wherein each contact web of the contact webs has a longitudinal direction and a width in a direction perpendicular the longitudinal direction of the each contact web and parallel to a plane of the radiation exit area, wherein a first contact web of the contact webs has a width that varies along the longitudinal direction thereof and contains a plurality of partial regions having a different width, and wherein at least one of the partial regions of the first contact web is located at a greater distance from the bonding pad and is wider than one of the partial regions of the first contact web located at a shorter distance from the bonding pad.

2. The luminescence diode chip as claimed in claim 1, wherein a distance $d_1$ between the bonding pad and at least one side flank of the luminescence diode chip is less than 30 μm.

3. The luminescence diode chip as claimed in claim 2, wherein a distance $d_2$ between the bonding pad and a further side flank of the luminescence diode chip is less than 30 μm.

4. The luminescence diode chip as claimed in claim 1, wherein at least one of the contact webs runs along a side edge of the luminescence diode chip, a distance from the side edge to the at least one of the contact webs being less than 15 μm.

5. The luminescence diode chip as claimed in claim 4, wherein the at least one of the contact webs adjoins the side edge of the luminescence diode chip.

6. The luminescence diode chip as claimed in claim 1, wherein the contact webs on the radiation exit area form a contour of at least one rectangle or square.

7. The luminescence diode chip as claimed in claim 6, wherein the contact webs form the contour of a plurality of rectangles or squares.

8. The luminescence diode chip as claimed in claim 7, wherein the plurality of rectangles or squares respectively have at least one common side edge.

9. The luminescence diode chip as claimed in claim 8, wherein the plurality of rectangles or squares respectively have two common side edges.

10. The luminescence diode chip as claimed in claim 6, wherein the bonding pad is arranged at a corner point of the at least one rectangle or square.

11. The luminescence diode chip as claimed in claim 1, wherein the contact webs enclose at least one partial region of the radiation exit area.

12. The luminescence diode chip as claimed in claim 11, wherein the contact webs enclose more than 80% of the radiation exit area.

13. The luminescence diode chip as claimed in claim 11, further comprising a luminescence conversion layer applied to a partial region of the radiation exit area enclosed by the contact webs.

14. The luminescence diode chip as claimed in claim 1, wherein the contact structure is in the form of a fork.

15. The luminescence diode chip as claimed in claim 14, further comprising a luminescence conversion layer applied to the radiation exit area between the contact webs.

16. The luminescence diode chip as claimed in claim 1, wherein the width of the first contact web increases continuously starting from the bonding pad.

17. The luminescence diode chip as claimed in claim 1, wherein the width of the partial regions of the first contact web is matched to a current intensity which occurs when the luminescence diode chip is being operated using the respective partial regions of the first contact web.

18. The luminescence diode chip as claimed in claim 1, wherein the contact webs have a width between 10 μm and 40 μm inclusive.

19. The luminescence diode chip as claimed in claim 1, wherein the luminescence diode chip is a thin-film luminescence diode chip.

20. The luminescence diode chip as claimed in claim 1, wherein the luminescence diode chip has an active layer containing $In_xAl_yGa_{1-x-y}N$ wherein $0 \leq x \leq 1$, $0 \leq y \leq 1$ and $x+y \leq 1$.

21. The luminescence diode chip as claimed in claim 1, wherein at least one side edge of the radiation exit area has a length of at least 400 μm.

22. The luminescence diode chip as claimed in claim 21, wherein the length of at least one side edge of the radiation exit area is at least 800 μm.

23. The luminescence diode chip as claimed in claim 1, wherein the luminescence diode chip is operated with a current intensity of at least 300 mA.

24. The luminescence diode chip as claimed in claim 1, wherein the contact structure is a patterned Ti—Pt—Au layer sequence.

25. The luminescence diode chip as claimed in claim 24, wherein the contact structure absorbs the radiation generated by the luminescence diode chip.

26. The luminescence diode chip as claimed in claim 1, wherein the contact structure is free of aluminum.

27. The luminescence diode chip as claimed in claim 1, wherein less than 15% of the radiation exit area is covered by the contact structure.

28. The luminescence diode chip as claimed in claim 1,
wherein the luminescence diode chip contains a semiconductor layer sequence which comprises an active layer, and
wherein a reflective contact layer is provided on a main area on a surface of the semiconductor layer sequence that is opposite a surface that the radiation exit area is on, a region of the main area that is opposite the bonding pad being spared from the contact layer.

29. The luminescence diode chip as claimed in claim 28,
wherein the contact webs enclose at least one partial region of the radiation exit area;
wherein a luminescence conversion layer is applied to the at least one partial region of the radiation exit area enclosed by the contact webs; and
wherein a region of the main area that is lateral of the luminescence conversion layer is spared from the contact layer.

* * * * *